Sept. 19, 1967 J. W. MOTTO, JR 3,343,104
GATE TURN-OFF DEVICE DRIVING A POWER SWITCHING SEMICONDUCTOR DEVICE
Filed July 30, 1964
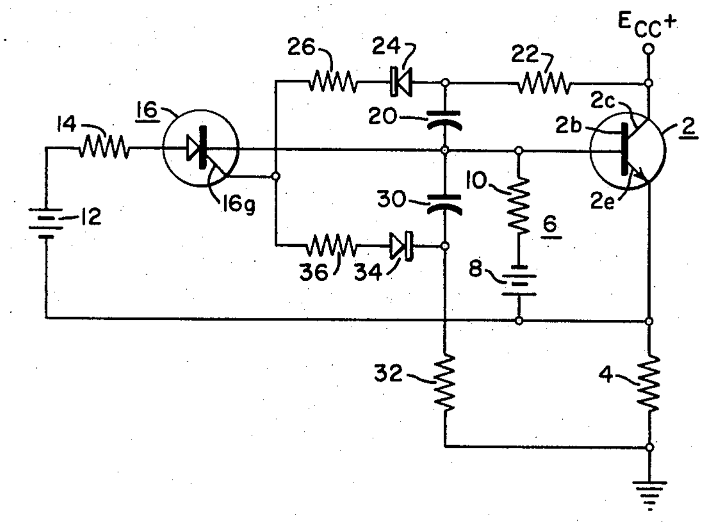
WITNESSES:
Bernard R. Gieguez
James F. Young
INVENTOR
John W. Motto, Jr.
BY Ernest P. Klipfel
ATTORNEY United States Patent Office 3,343,104
Patented Sept. 19, 1967

3,343,104

GATE TURN-OFF DEVICE DRIVING A POWER SWITCHING SEMICONDUCTOR DEVICE

John W. Motto, Jr., Greensburg, Pa., assignor to Westinghouse Electric Corporation, Pittsburgh, Pa., a corporation of Pennsylvania Filed July 30, 1964, Ser. No. 386,316
6 Claims. (Cl. 331—111)

ABSTRACT OF THE DISCLOSURE

The combination of a gate turn-off device providing rapid rise and decay of base drive to a power switching semiconductor device to minimize switching losses.

The present invention relates generally to semiconductive switching circuitry and more particularly to semiconductive switching circuitry utilizing a gate turn-off controlled rectifier in the control circuit of a semiconductive switching device such as a transistor.

The advent of controlled rectifiers having a gate turn-off characteristic, or gate turn-off devices, has given rise to much new and useful switching circuitry. A gate turn-off device can be turned on by a positive gate current pulse and turned off by a negative gate current pulse. One such gate turn-off device is as described and claimed in Patent No. 3,210,563 issued Oct. 5, 1965 to T. C. T. New, inventor, asigned to the present assignee. As more fully described therein, four regions of alternate P-type and N-type conductivity material form a first outer region, a first inner region, a second inner region and a second outer region joined seriatim. One of the outer regions (cathode-emitter) is of considerably smaller area than the other outer region (anode). A gate electrode connected to the inner region closer to the cathode allows the control of direct current as well as AC current since a positive gate current pulse will block current flow from the anode to the cathode in addition to the usual feature of a positive gate current pulse allowing current from the anode to the cathode of the device. Of course any suitable device having the aforementioned characteristics may be used.

The amount of power that can be switched by a gate turn-off device is relatively small compared to the capabilities of other semiconductive switching devices. The present characteristics of the gate turn-off device is limited to the interruption of about one ampere at medium to high voltage applications. On the other hand, an attractive feature of the gate turn-off device is the very rapid turn-on and turn-off times of such a device. When compared with switching transistors, the gate turn-off device can respond to a pulse input of short duration to switch operating modes. A transistor requires a continuous drive input to maintain the device in its conductive mode.

The present invention utilizes the power handling capabilities of a semiconductive switching device such as a transistor and the rapid turn-on and turn-off times of a gate turn-off device. Briefly, a gate turn-off device is used to control the base drive of a high ampere-high voltage transistor. Rapid rise and decay of the gate drive to the transistor is ideal for low transistor switching times which reduce switching losses. Additionally, a base drive circuit for a transistor which base drive circuit utilizes a gate turn-off device will result in a high efficiency circuit due to the high energy gain obtainable with pulse input circuits.

Accordingly, an object of the present invention is to provide semiconductive switching circuitry having greatly reduced switching losses.

Another object of the present invention is to provide semiconductive switching circuitry making use of the high energy gain obtainable with pulse input circuits to provide a high efficiency switching circuit.

Another object of the present invention is to provide semiconductive switching circuitry utilizing the rapid turn-on and turn-off characteristics of a gate turn-off device.

Yet another object of the present invention is to provide a circuit for controlling the base drive of a switching transistor with optimum base drive conditions.

Further objects and advantages of the present invention will be readily apparent from the following detailed description taken in conjunction with the drawing, in which the sole figure is an electrical schematic diagram of an illustrative embodiment of the present invention.

The present invention is illustrated as embodied in an an astable free-running multivibrator or DC chopper similar to that described and claimed in my Patent No. 3,299,297 issued Jan. 17, 1967 entitled "Semiconductor Switching Circuitry," and assigned to the present assignee. However, the present invention overcomes the limiting power handling capabilities of a gate turn-off device by utilizing a semiconductive switching device such as a transistor for switching power to a load circuit and using a gate turn-off device for rapdily controlling the rise and decay of base drive to the transistor to reduce switching losses of the transistor.

More particularly, a semiconductive switching device such as a transistor 2, having a base or control electrode 2*b*, a collector electrode 2*c* and an emitter electrode 2*e*, is connected to control power from a voltage source $E_{CC}^{+}$ (not shown) to a utilization load 4.

A biasing circuit 6 comprising a source of potential 8 and a current limiting resistor 10 provides a negative polarity signal to the transistor 2. The base to emitter circuit of transistor 2 is therefore reverse biased by the source of potential 8 and the transistor is in its off or nonconducting state.

A second source of potential 12 of opposite polarity to the source of potential 8, and a current limiting resistor 14 are connected across the base-emitter circuit of the transistor 2 by means of a gate turn-off device 16.

The gate turn-off device 16 is poled to allow a base drive or signal to the transistor 2 in response to a positive gate trigger signal to its gate electrode 16*g*. The gate turn-off device will be turned off, rendered nonconductive, in response to the negative gate trigger signal to the gate electrode 16*g*. Since the switching transistor 2 requires a continuous base drive to stay in its conducting state, it can be seen that a pulse to the gate electrode of the gate turn-off device 16 will be sufficient to turn-on or off the device 16 and thereby control base drive by the source of potential 12 to the base electrode 2*b*. Accordingly, high energy gain obtainable with pulse input circuits is provided to the semiconductive switching device 2 since the gate turn-off device 16 responds to a trigger input and in turn provides a continuous drive signal to the transistor 2. At the same time, the rapid turn-on and turn-off times of the gate turn-off device 16 are ideal for low transistor switching times since the rise and decay of the base drive to the transistor 2 will provide optimum base drive conditions for the transistor 2 to be utilized in a switching mode. Switching will be accomplished with a minimum of losses.

To provide a positive gate current pulse to the gate electrode 16*g* a capacitor 20 is connected through a current limiting resistor 22 across the base-collector circuit of the transistor 2. A reference device 24, such as a four-layer breakdown diode or Shockley diode, connects the capacitor 20 through a resistor 26 to the gate electrode 16*g*.

Similarly, a capacitor 30 is connected in the base-emitter circuit of the transistor 2 by means of a resistor 32 connected to the opposite side of the load 4 connected to the emitter electrode *2e*. A second reference device 34, poled in an opposite direction to its counterpart 24, connects the capacitor 30 through a resistor 36 to the gate electrode 16*g*.

In operation, and assuming initially that the gate turn-off device 16 is off, the base to emitter circuit of the transistor 2 is reverse biased by the source of potential 8 thereby rendering the switching transistor 2 to its non-conducting state blocking the applied voltage source $E_{CC}$ from the load 4. The voltage source however, appears across the collector to base junction of the transistor 2 and the capacitor 20 charges through the charging resistor 22. When the voltage across the capacitor 20 exceeds the reference level of the breakdown diode 24 the capacitor 20 will discharge through the resistor 26 into the gate 16*g* of the gate turn-off switch 16. The positive gate current pulse turns on the gate turn-off device 16 and the base current of the transistor 2 will then rapidly increase to a value determined by the source of poteintial 12 and resistor 14. It is a simple matter to provide sufficient base current to the transistor 2 to switch it into saturation or its conductive mode thereby conducting the current in the load circuit determined by the collector supply voltage $E_{CC}$ and the load resistor 4.

With the transistor 2 in its conductive mode, the applied voltage will appear across the load resistor 4. The capacitor 30 will charge through the charging resistor 32 to the breakdown voltage of the breakdown diode 34. Capacitor 30 will then discharge out of the gate electrode 16*g* and the gate turn-off device 16 will rapidly turn-off removing the base drive from the transistor 2. The source of potential 8 will sweep the stored charge from the base region of the transistor 2 and once again reverse bias the transistor base to emitter junction thereby turning the transistor off. The cycle will then repeat as capacitor 20 will again start to charge through resistor 22.

Since the control circuit of the transistor 2 is a low voltage application and turn-off currents of four amperes are not uncommon in presently available gate turn-off devices, the diode 16 is easily capable of providing two times the minimum base drive required of a 20 amp transistor with a gain of 10. That is, while a base drive of only two amperes may be required to control conduction of the switching transistor 2, the gate turn-off device 16 is capable of switching two times the necessary base drive, which is of sufficient magnitude to quickly overdrive the switching transistor 2 for optimum switching at the lowest possible switching time.

The circuit as illustrated in FIG. 1 has been built and operated successfully. Typical values of devices utilized in the illustrative embodiment are as follows:

$E_{CC}+$=24 v. DC
Source of potential 8=6 v. DC
Source of potential 12=12 v. DC
Transistor 2=Westinghouse 109XA
Gate turn-off device 16=Westinghouse Type 241
Breakover diodes 24 and 34=Westinghouse Type 4E20–28
R22, R32=470 ohms, 2 w.
R14=.5 ohm, 10 w.
R26, R36=22 ohms, 2 w.
R10=100 ohms, 2 w.
R Load=1 ohm, 500 w.
C20, C30=1.0 microfarad The turn-on and turn-off times of a typical 20 ampere transistor such as the Westinghouse Type 109XA is less than six microseconds indicating optimum base drive conditions. The voltage of the supply was 24 volts and the power delivered to the load was approximately 400 watts. A 200 volt transistor and power supply with a 10 ohm load would provide switching power of 4 kilowatts.

While the present invention has been described with a degree of particularity for the purposes of illustration, it is to be understood that all modifications, alterations, and substitutions within the spirit and scope of the present invention are herein meant to be included. For example, while the present invention has been illustrated as embodied in a DC chopper circuit, it is to be understood that any circuit requiring rapid rise and decay of base drive to a semiconductive switching device will find application of the present invention. The time delay circuits for providing gate current pulses to the gate turn-off device 16 may take any desirable form with the time delays selected for bistable operation of the transistor 2 by alternately pulsing with positive and negative pulses the gate electrode 16*g* of the gate turn-off device 16 without the use of timing circuitry or with timing circuitry to change the pulse repetition rate. Other devices such as unijunction transistors, neon tubes or manual push buttons may to be used to replace the function of the reference devices 24 and 34. While a semiconductive switching device of NPN type has been shown for the purposes of illustration, it is understood that PNP type switching transistors may be utilized with suitable changes in the polarity of the various voltage supplies and sources of potential.

I claim as my invention:

1. In combination; a load circuit adapted to be connected to a voltage source; a semiconductive switching device including at least a base electrode, a collector electrode and an emitter electrode and having a conducting state and a non-conducting state for controlling current in said load circuit; means for connecting said base electrode to a first source of potential; a gate turn-off device; means for connecting a second source of potential through said gate turn-off device to said base electrode; said first and second sources of potential being of such a polarity that the semiconductive switching device is in one state when said gate turn-off device is off and is in the other state when said gate turn-off device is turned on; pulse means for alternately turning on and turning off said gate turn-off device; and means for delaying the alternating of said last-mentioned means for a predetermined time after either turning on said gate turn-off device or turning off said gate turn-off device; said means for delaying including a first capacitor connected across said base-collector circuit to be charged when said semiconductive device is in said one state; a second capacitor connected across said base-emitter circuit to be charged when said semiconductive device is in said other state; and reference means for enabling said pulse means to turn-on said gate turn-off device in response to a predetermined charge on one of said capacitors and for enabling said pulse means to turn-off said gate turn-off device in response to a predetermined charge on the other of said capacitors.

2. The combination of claim 1 wherein said reference means includes a breakover diode.

3. A circuit for controlling the mode of a switching device having a conducting mode and a non-conducting mode comprising, in combination; means for biasing said switching device to its non-conducting mode; and means including a gate turn-off device for rendering said switching device to its conducting mode when said gate turn-off device is on in response to a first pulse and being ineffective in response to a second pulse.

4. A direct current chopper circuit comprising, in combination; a load circuit adapted to be connected to a direct current voltage source; transistor means for switching current in said load circuit; bias means for providing a first drive signal to render said transistor non-conducting; means for providing a second drive signal to render said transistor conducting; gate turn-off means for switching said second drive signal on and off in response to a first trigger signal and a second trigger signal respectively; first time delay means responsive to the non-conducting state of said transistor for providing said first trigger signal to said gate turn-off means; and a second time delay means responsive to the conducting state of said transistor for providing said second pulse signal to said gate turn-off means.

5. The combination of claim 4 wherein said first and second time delays are substantially equal in duration.

6. The apparatus of claim 4 wherein each time delay means includes the capacitor to be charged in response to the state of said transistor and a breakover diode for allowing discharge of said capacitor to provide a trigger signal to said gate turn-off device upon said capacitor exceeding the breakover magnitude of said breakover diode.

References Cited

UNITED STATES PATENTS

| | | | |
|---|---|---|---|
| 3,089,964 | 5/1963 | Bruce et al. | 307—88.5 |
| 3,197,716 | 7/1965 | Wright et al. | 307—88.5 |
| 3,200,306 | 4/1965 | Atkins et al. | 307—88.5 |

ARTHUR GAUSS, *Primary Examiner.*

J. BUSCH, *Assistant Examiner.*